(12) United States Patent
Kakizaki et al.

(10) Patent No.: US 6,326,279 B1
(45) Date of Patent: Dec. 4, 2001

(54) PROCESS FOR PRODUCING SEMICONDUCTOR ARTICLE

(75) Inventors: Yasuo Kakizaki, Yokohama; Takao Yonehara, Atsugi; Nobuhiko Sato, Sagamihara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/532,079

(22) Filed: Mar. 21, 2000

(30) Foreign Application Priority Data

Mar. 26, 1999 (JP) .................................................. 11-084647

(51) Int. Cl.[7] .................................................. H01L 21/76
(52) U.S. Cl. ............................................ 438/406; 438/455
(58) Field of Search .................................. 438/406, 409, 438/455, 456, 457, 458, 479, 735, 753, 964

(56) References Cited

U.S. PATENT DOCUMENTS

| 5,371,037 | 12/1994 | Yonehara . |
| 5,466,631 | 11/1995 | Ichikawa et al. . |
| 5,854,123 | 12/1998 | Sato et al. . |
| 5,856,229 | 1/1999 | Sakaguchi et al. .................. 438/406 |
| 6,054,363 | * 4/2000 | Sakaguchi et al. .................. 438/406 |
| 6,143,628 | * 11/2000 | Sato et al. .............................. 438/455 |

FOREIGN PATENT DOCUMENTS

| 9-102594 | 4/1997 | (JP) . |
| 9-237884 | 9/1997 | (JP) . |
| 10-233352 | 9/1998 | (JP) . |
| 11-42840 | 2/1999 | (JP) . |

* cited by examiner

*Primary Examiner*—David Nelms
*Assistant Examiner*—Dung A Le
(74) *Attorney, Agent, or Firm*—Fitzpatrick, Cella, Harper & Scinto

(57) ABSTRACT

To lessen the number of steps and reduce cost in the manufacture of high-quality SOI substrate, a process for producing a semiconductor article comprises the steps of forming a porous semiconductor layer at at least one surface of a first substrate, forming a non-porous single-crystal semiconductor layer on the porous semiconductor layer, bonding the first substrate to a second substrate with the former's non-porous single-crystal semiconductor layer facing the latter in contact, to form a bonded structure, and dividing the bonded structure at the porous semiconductor layer, wherein the process further comprises the step of previously forming on the one surface of the first substrate an epitaxial silicon layer in a thickness at least n-times ($n \geq 2$) the thickness of the porous semiconductor layer.

22 Claims, 6 Drawing Sheets

FIG. 3A
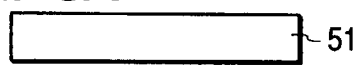
FIG. 3B
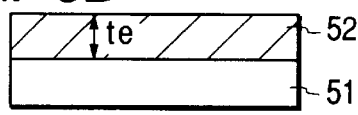
FIG. 3C
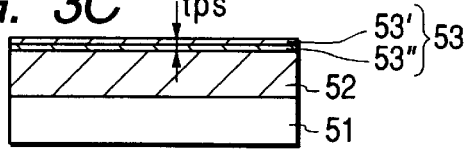
FIG. 3D
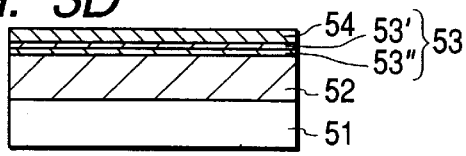
FIG. 3E
FIG. 3F
FIG. 3G
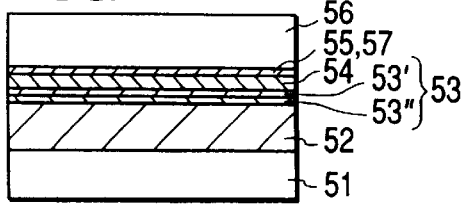
FIG. 3H
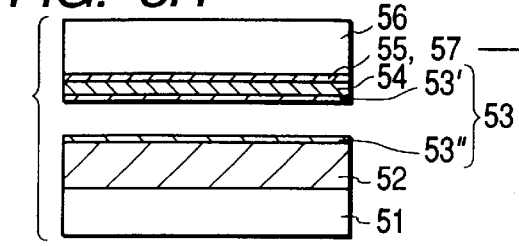
FIG. 3I
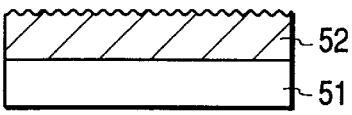
FIG. 3J
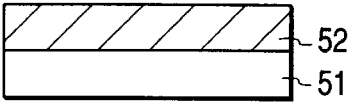
FIG. 3K
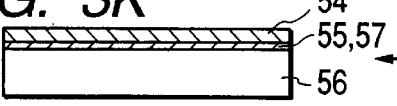

PROCESS FOR PRODUCING SEMICONDUCTOR ARTICLE

BACKGROUND OF THE INVENTION

1. Field of the Invention

This invention relates to a process for producing a semiconductor article.

2. Related Background Art

Formation of single-crystal semiconductor layers on insulators is widely known as silicon-on-insulator or semiconductor-on-insulator (hereinafter "SOI") technique. A large number of researches have been made thereon because the devices utilizing the SOI technique have numerous superior points that can not be achieved by usual bulk silicon substrates on which silicon integrated circuits are to be fabricated. More specifically, the utilization of SOI technique brings about the some advantages, that is, the SOI technique is superior in, e.g., the following points.

(1) It enables high integration with easy separation of dielectrics.
(2) It promises a superior radiation resistance.
(3) Stray capacity can be reduced to enable high-speed performance.
(4) The step of welding can be omitted.
(5) Latch-up can be prevented.
(6) Perfect depletion electric-field effect transistors can be accomplished by thin-film formation.

Among processes for producing SOI silicon wafers, the process as disclosed in U.S. Pat. No. 5,371,037, in which a single-crystal semiconductor layer is formed on a porous layer and this semiconductor layer is transferred to a supporting substrate via an insulating layer, is very superior in view of the advantages such that SOI layers have good film-thickness uniformity, the crystal defect density of SOI layers can be controlled with ease, SOI layers have a good surface smoothness, any specially designed expensive apparatus are not required in its production, and SOI having a film thickness ranging from tens of nanometers to about 10 $\mu$m can be produced using the same apparatus.

In combination with the above process, the process disclosed in U.S. Pat. No. 5,856,229 may be employed, i.e., a process in which, using as a first substrate a substrate having a porous layer, a non-porous single-crystal semiconductor layer is formed on the porous layer, the first substrate is bonded to a second substrate with the former's non-porous single-crystal semiconductor layer facing the latter in contact, thereafter the resultant bonded structure is divided at the porous layer without breaking both the first and second substrates, and the surface of the first substrate is smoothed, on which a porous layer is again formed so that the substrate can be reused. With repetition of this process, the first substrate can be used again and again.

Thus, this process can bring about a great effect that the production cost can greatly be reduced and also the production process itself can be simplified. As methods of dividing the bonded structure without breaking both the first and second substrates, the following methods are available.

They are, e.g., a method in which the bonded structure is pulled in the direction vertical to the bonded surface, a method in which a shear stress is applied in parallel to the bonded surface (e.g., a method in which the respective substrates are moved in the direction opposite to each other at the plane parallel to the bonded surface or a method in which the respective substrates are turned in the opposite directions), a method in which a pressure is applied in the direction vertical to the bonded surface, and a method in which a vibratory energy such as ultrasonic waves is applied to the dividing region.

Also available are a method in which a separating member (e.g., a sharp blade such as a knife) is inserted to the dividing region from the side face of the bonded structure in parallel to the bonded surface, a method in which an expansion energy of a substance made to soak into the porous layer that functions as a dividing region is utilized, a method in which the porous layer that functions as a dividing region is thermally oxidized from the side face of the bonded structure to cause the porous layer to undergo volume expansion to divide the bonded structure, a method in which the porous layer that functions as a dividing region is selectively etched from the side face of the bonded structure to divide the bonded structure, and a method in which a layer capable of producing microcavities formed by ion implantation as the dividing region is used and is heated by irradiation with laser light to divide the bonded structure.

In a prior-art process for producing a semiconductor article by forming a porous layer at the surface of a first substrate, forming a non-porous single-crystal semiconductor film on the porous layer, bonding it to a second substrate, and removing the porous layer so as to transfer the non-porous single-crystal semiconductor film onto the second substrate, the structure of the porous layer formed at the surface of the first substrate relates closely to the number of stacking faults brought into the non-porous single-crystal semiconductor film formed on the porous layer. Accordingly, in order to control the structure of the porous layer, the specific resistance of the first substrate must be controlled.

In general, the stacking faults are said to increase the leak current at p-n junction when metal impurities become deposited at dislocated areas surrounding the stacking faults, to deteriorate the lifetime of minority carriers. Also, there is a possibility of causing the deterioration of breakdown strength of oxide films with the deposition of metal impurities. Accordingly, in putting SOI wafers into practical use, it is an important subject to lower the density of such stacking faults. In particular, the increase in leak current at p-n junction is fatal in the case of bipolar transistors.

In the case of usually available CZ (Czochralski) substrates, however, even in the ingot, its specific resistance is 0.01 to 0.02 $\Omega \cdot$cm, which is seen to be uneven by as much as ±50%. Such uneven specific resistance makes it difficult to control porous structure, and the porous structure greatly affect the density of stacking faults brought into the non-porous single-crystal semiconductor film formed on the porous layer, or the control of structure of high-porosity layers used to divide bonded structures. That is, in the manufacture of SOI wafers, it is important to control their specific resistance stably, but is difficult as long as CZ substrates are used.

As a means for overcoming such a problem, as disclosed in Japanese Patent Application Laid-Open No. 9-102594, a method is available in which elements capable of controlling conductivity type are diffused into a silicon substrate to form a diffused region. In this method, however, the thickness of such a diffused region is controlled chiefly by controlling the temperature and time of heat treatment, and hence the substrate in-plane uniformity of specific resistance and also the specific resistance in the depth direction of the substrate surface may become distributed. Also, the use of CZ substrates leaves problems of swirls and COP discussed below.

In CZ substrates commonly used, swirls and COP are present. Where substrates having COP are used in the manufacture of SOI wafers, this COP, when present in the SOI layer, leads to the formation of defects called HF defects. Silicon is not present at the part of HF defects, and hence such defects are fatal for SOI substrates.

Where swirls caused by uneven density of substrate in-plane impurities are present, the porous structure causes uneven in-plane distribution of porous film thickness when the porous layer is formed. Also, in an attempt to form by diffusion, e.g., a $10^{18}/cm^3$-boron-doped layer in a thickness as large as 10 μm, the boron density reaches $10^{19}/cm^3$ to $10^{20}/cm^3$ in the vicinity of the surface in the initial stage of diffusion, so that defects tend to be brought into it.

Accordingly, as a method of controlling the specific resistance of the first substrate, a method is available in which epitaxial silicon is used in the region where the porous layer is formed. Where porous silicon is formed in an epitaxial silicon layer followed by subsequent steps to produce an SOI wafer, the epitaxial silicon must be again formed on the first substrate. Hence, the step of forming epitaxial silicon must be taken by the same number of times as the formation of the SOI wafer. The growing of epitaxial silicon requires a large number of steps and also takes a time, and comes into question in view of production cost. This point will be detailed below.

FIGS. 6A to 6K are diagrammatic view to illustrate a conventional process for producing a semiconductor article.

As shown in FIG. 6A, a first substrate 11 such as a silicon substrate is prepared.

As shown in FIG. 6B, an epitaxial growth layer 12 is formed on the surface of the first substrate 11.

As shown in FIG. 6C, the epitaxial growth layer 12 is made porous by, e.g., anodization to form a porous layer 13.

As shown in FIG. 6D, a non-porous semiconductor layer 14 is epitaxially grown on the surface of the porous layer 13.

As shown in FIG. 6E, an insulating layer 15 is optionally formed on the surface of the semiconductor layer 14.

As shown in FIG. 6F, a second substrate 16 such as a silicon substrate is prepared. An insulating layer 17 is optionally formed on the surface of the second substrate 16.

As shown in FIG. 6G, the first and second substrates 11 and 16 are bonded to each other.

As shown in FIG. 6H, a dividing force is externally applied to the first and second substrates 11 and 16 (i.e., a bonded structure), whereupon the bonded structure is cracked at the porous layer, having relatively a low mechanical strength, thus the first and second substrates 11 and 16 are separated.

A residual porous body 13B remains on the divided surface of the first substrate 11 thus separated, and a residual porous body 13A remains on the separated surface of the second substrate 11 thus separated (actually, on the surface of the semiconductor layer 14).

As shown in FIG. 6I, the residual porous body 13B is removed by, e.g., etching.

As shown in FIG. 6J, the surface having a surface roughness caused by the etching is smoothed by hydrogen annealing or polishing.

The residual porous body 13A on the second substrate 16 is also removed by, e.g., etching, and the surface is smoothed by hydrogen annealing. Thus, a semiconductor article having an SOI structure as shown in FIG. 6K is obtained.

When another semiconductor article having an SOI structure is produced, the step shown in FIG. 6B may be repeated to again form an epitaxial growth layer 12 on the surface of the first substrate 11 obtained in the step of FIG. 6J, and then the steps of FIGS. 6B to 6H and 6J may be followed.

Here, the step of epitaxial growth shown in FIG. 6B is always carried out every time the porous layer 13 is formed.

Hence, this step of epitaxial growth has caused an increase in production cost in the manufacture of semiconductor articles.

SUMMARY OF THE INVENTION

Accordingly, an object of the present invention is to produce a semiconductor article at a low cost.

To achieve the above object, the present invention provides a process for producing a semiconductor article, comprising the steps of:

forming a porous semiconductor layer at at least one surface of a first substrate;

forming a non-porous single-crystal semiconductor layer on the porous semiconductor layer;

bonding the first substrate to a second substrate with the former's non-porous single-crystal semiconductor layer facing the latter in contact, to form a bonded structure; and dividing the bonded structure at the porous semiconductor layer; wherein, the process further comprises the steps of:

previously forming on the one surface of the first substrate an epitaxial growth layer in a thickness at least n-times (n≧2) the thickness of the porous semiconductor layer; and again forming a porous semiconductor layer on the epitaxial growth layer after the step of dividing the bonded structure.

The present invention also provides a process for producing a semiconductor article, comprising the steps of:

forming on a surface of a substrate an epitaxial growth layer in a thickness of the;

forming at a surface of the epitaxial growth layer a porous layer having a thickness of tps, where the tps and the te satisfy te≧2 tps;

forming a non-porous layer on the porous layer;

peeling the non-porous layer from the substrate; and again forming a porous layer on the surface of the epitaxial growth layer after the peeling.

The above process may further comprise the steps of:

smoothing the surface of the epitaxial growth layer remaining after the step of peeling;

forming the porous layer at the surface of the remaining epitaxial growth layer thus smoothed;

forming a non-porous layer on the porous layer; and peeling the non-porous layer from the substrate.

According to the present invention, the epitaxial growth layer is beforehand epitaxially grown in a thickness beforehand estimating the loss of that layer consumed in the second-round and subsequent steps of forming the porous layer.

Thus, it is unnecessary to again carry out the epitaxial growth as shown in FIG. 6B, immediately before the second-round and subsequent formation of the porous layer. Hence, the production cost can be kept from increasing with the repetition of epitaxial growth.

BRIEF DESCRIPTION OF THE DRAWINGS

FIGS. 3A, 3B, 3C, 3D, 3E, 3F, 3G, 3H, 3I, 3J and 3K illustrate a process for producing a semiconductor article according to another embodiment of the present invention.

DESCRIPTION OF THE PREFERRED EMBODIMENTS

EMBODIMENT 1

FIGS. 1A to 1K show a process for producing a semiconductor article according to the present embodiment. A basic production process of the present invention will be described below with reference to FIGS. 1A to 1K.

Figure 1A:
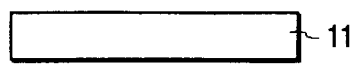
FIGS. 1A, 1B, 1C, 1D, 1E, 1F, 1G, 1H, 1I, 1J and 1K illustrate a process for producing a semiconductor article according to an embodiment of the present invention.

First, as shown in FIG. 1A, a first substrate 11 such as a single-crystal silicon substrate is prepared.

As the first substrate, a p-type or n-type semiconductor substrate may preferably be used. Stated specifically, it is a single-crystal substrate of an elemental semiconductor, such as a silicon wafer; or a single-crystal substrate of a compound semiconductor, such as an SiGe, SiC or GaAs wafer. Since epitaxial growth is effected thereon as described next, the substrate may have a specific resistance in a broad tolerance range of, e.g., from 0.01 Ω·cm to 100 Ω·cm. Accordingly, without limitation to high-grade wafers, low-grade wafers may also be used which are available as dummy grades.

Figure 1B:
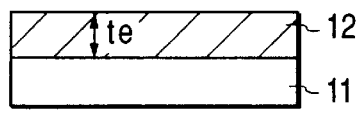

Next, as shown in FIG. 1B, an epitaxial growth layer 12 is formed on at least one surface of the first substrate 11.

This epitaxial growth layer 12 is formed in a layer thickness "te" which is at least twice, and preferably at least three times, the layer thickness "tps" of a porous layer described later.

In epitaxial growth, the specific resistance can be very strictly controlled by controlling impurities during crystal growth, and this is a very effective means for controlling porous structure. Also, the structure of the porous layer is controlled by the specific resistance of the epitaxial growth layer formed on the surface of the first substrate, and hence it becomes unnecessary to select the type of the first substrate on which the epitaxial growth layer is to be formed.

The epitaxial growth layer 12 formed on the surface of the first substrate 11 may be formed by any process as long as crystal defects may become present with difficulty. Stated specifically, it may be formed by, e.g., molecular-beam epitaxy, plasma CVD, thermal CVD, photo-assisted CVD, bias sputtering or liquid-phase epitaxy.

The epitaxial growth layer 12 may be any of layers that can be made porous by, i.e., anodization, or hydrogen or inert-gas ion implantation. It may be formed of a semiconductor such as Si, Ge, C, SiGe, SiC, GaAs, GaAlAs, InP or GaN.

The epitaxial growth layer 12 may have a specific resistance suited for the formation of the porous layer, without any particular limitations. It may preferably have a specific resistance the in-plane distribution of which is narrower than ±10% to ±5%. Also, the epitaxial growth layer 12 may have an uneven thickness within a range narrower than ±10% to ±3%.

The epitaxial growth layer 12 is provided with a dividing region.

The dividing region is meant to be a region which is collapsed, or a region which is cracked, in the subsequent dividing step. As a principal example, the dividing region is a region formed in layer in parallel to the surface at a portion lying down from the surface and at which the bonded structure can be divided without breaking the surface and the vicinity thereof.

In the present embodiment, the dividing region may preferably lies at a position which is formed in the epitaxial growth layer formed on the first substrate and is different from the bonded surface (joined surface) interfacing with the second substrate. In the dividing step, the bonded structure must not be divided at the bonded interface, but divided at the dividing region lying at a position different from the bonded interface.

Accordingly, the dividing region may preferably be made to have a mechanical strength which is lower than the mechanical strength of the bonded interface so that in the dividing step the dividing region is broken earlier than the bonded interface. Thus, upon break of the dividing region, the part having a certain thickness on the surface side of the first substrate becomes separated from the first substrate as it is kept bonded to the second substrate, so that this part is transferred to the second substrate. As a typical example of the dividing region, a porous layer may be used which has at least one of closed pores and open pores.

Figure 1C:
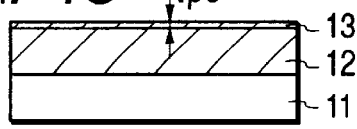

Next, to provide such a dividing region, as shown in FIG. 1C the epitaxial growth layer 12 is made porous at its surface to form a porous semiconductor layer 13 comprised of, e.g., porous silicon.

At this stage, the porous layer 13 may preferably have a layer thickness tps which is not larger than a half (½) of a layer thickness te of the epitaxial growth layer.

The porous layer suited for the dividing may have a porosity usually ranging from 10% to 80%, and preferably from 20% to 60%.

The porous layer may be formed by, e.g., anodization or ion implantation.

The porous layer may be a single layer having a single porosity, or may preferably be formed of a plurality of porous bodies so that the bonded structure can mechanically be divided with ease and the position of the part to be cracked may appear stably.

Such porous bodies may be in two layers or in three or more layers, and may have porosities changing discontinuously at the interface(s) of such layers or may have porosities changing continuously.

As a porous layer positioned on the side of the epitaxial growth layer, a low-porosity layer may preferably be used which has relatively a low porosity, in other words, is occupied with pores (bubbles or cavities) in a low proportion, and may particularly preferably be a layer having a porosity lower than 30%. The low-porosity layer may preferably have a thickness of from 0.1 μm to 100 μm.

As a porous layer positioned distantly from the epitaxial growth layer, a high-porosity layer is preferred, which may preferably have a porosity not lower than 30%. Such a high-porosity layer has relatively a low mechanical strength and tends to cause a stress concentrated at its interfaces, Hence, this layer is preferentially cracked or collapsed on its interior or at its upper and lower interfaces. The high-porosity layer may preferably have a thickness of 5 μm at maximum.

Figure 1D:
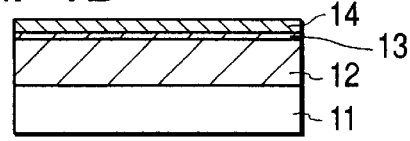

Thereafter, as shown in FIG. 1D, a non-porous single-crystal semiconductor layer 14 such as a non-porous single-crystal silicon layer is formed on the surface of the porous layer 13.

When such a single-crystal layer 14 is formed, rearrangement of pores inside the porous silicon layer 13 may occur if it is formed at 1,000° C. or above, to damage the performance of enhanced etching. Accordingly, before the single-crystal layer 14 is formed, protective films (oxide films) may preferably be formed on the pore inner walls of the porous layer. Such protective films can be formed by subjecting the porous layer to heat treatment at a temperature of from about 300° C. to 600° C. in an oxidizing atmosphere. Thereafter, the single-crystal layer 14 may preferably be formed by, e.g., molecular-beam epitaxy, plasma CVD, thermal CVD, photo-assisted CVD, bias sputtering or liquid-phase epitaxy.

Stated in detail, before the epitaxial growth, the porous layer may be subjected to heat treatment in a hydrogen-containing reducing atmosphere.

The hydrogen-containing reducing atmosphere is meant to be an atmosphere of 100% hydrogen or a mixed atmosphere of hydrogen and an inert gas.

The heat treatment may be made at a temperature of from 800° C. to 1,200° C.

Figure 1E:
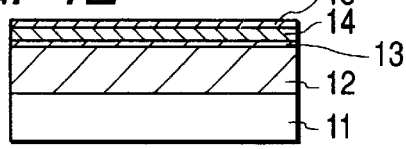

Next, as shown in FIG. 1E, an insulating layer 15 is optionally formed on the non-porous single-crystal semiconductor layer 14. Also, as shown in FIG. 1F, a second substrate 16 such as a glass, quartz or silicon substrate is prepared, and an insulating layer 17 is optionally formed on at least one surface of the second substrate 16.

Figure 1F:
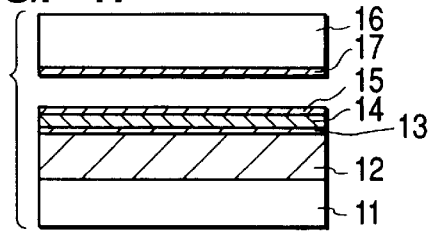

In the case where the surfaces of the insulating layers are brought into contact with each other to effect bonding as shown in FIG. 1F, it is also preferable to expose at least one surface to nitrogen plasma or oxygen plasma to activate the surface.

Figure 1G:
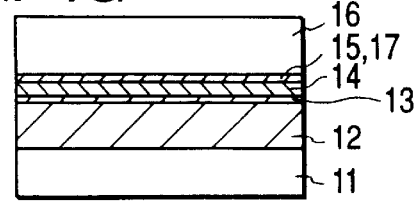

Then, as shown in FIG. 1G, the first substrate 11 and the second substrate supporting substrate 16 are brought into close contact with each other via the insulating layers 15 and 17 at room temperature, followed by bonding by anodic bonding, pressing or heat treatment, or in combination of any of these. Thus, the supporting substrate 16 and the non-porous single-crystal layer 14 are strongly bonded via the insulating layers 15 and 17. Incidentally, the insulating layers 15 and 17 may be formed on at least one of the non-porous single-crystal layer 14 and the supporting substrate 16, or may be bonded in triple layer interposing the insulating layers 15 and 17 between the non-porous single-crystal layer 14 and the supporting substrate 16.

Figure 1H:
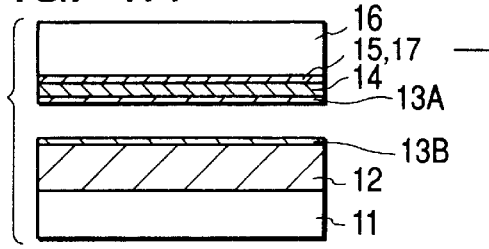
Figure 1I:
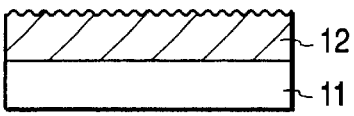

Next, as shown in FIG. 1H, the bonded structure thus obtained is divided at the interior of the porous layer 13 and/or at any of its upper and lower interfaces. How to divide the bonded structure will be detailed later. The supporting substrate 16 side comes to be a composite member having a structure of porous body 13A/non-porous single-crystal layer 14/insulating layers 15 an 17/supporting substrate 16. Then the porous body 13A remaining on the divided surface is selectively removed.

Only the porous body 13A is removed by electroless wet chemical etching by the use of at least one of hydrofluoric acid, a mixture solution prepared by adding at least one of an alcohol and hydrogen peroxide water to hydrofluoric acid, buffered hydrofluoric acid, and a mixture solution prepared by adding at least one of an alcohol and hydrogen peroxide water to buffered hydrofluoric acid. Thus the non-porous single-crystal layer 14, formed in thin film, is made to remain on the supporting substrate 16 via the insulating layers 15 and 17.

As stated above, on account of an enormous surface area of the porous body, only the porous body 13 can be removed by etching.

When, however, the bonded structure is cracked (ruptured, chapped or fissured) at the interface between the porous layer 13 and the non-porous single-crystal semiconductor layer 14 and the residual porous body 13A little present on the layer 14, the above step of etching is unnecessary.

In the case where the interior of the porous layer is cracked to divide the bonded structure and the porous body 13A remains on the divided surface, it is necessary to remove the porous body in that way.

The first substrate left after the bonded structure has been thus divided, the rough surface after the dividing is smoothed so that it can be used as a substrate on which the epitaxial growth layer has already been formed.

As methods for smoothing the rough surface after the dividing, it may be smoothed by polishing or hydrogen annealing. The hydrogen annealing is preferred because the substrate can be less worn out and the step of separating the epitaxial silicon (single-crystal layer 14) can be passed in a larger number of times after the epitaxial growth layer 12 has been deposited once.

With regard to the hydrogen annealing, the surface of an SOI substrate may be smoothed by making heat treatment in an atmosphere containing hydrogen as disclosed in a publication U.S. Pat. No. 5,869,387. As so proposed by the present inventors, it is reported that this smoothing is effective enough to bring about an improvement comparable to the smoothness of polished silicon wafers even when more surface unevenness than that of commercially available silicon wafers is present on the surface after the etching of the substrate.

Meanwhile, when the polishing is employed, the removal of the residual porous body and the smoothing can be carried out in the same step. In this case, the non-porous single-crystal layer 14 is used as a polishing stopper, and the porous layer 13 is removed by selective polishing. FIG. 1K shows a semiconductor article thus obtained. The thin-film non-porous single-crystal layer 14 is formed on the supporting substrate 16 via the insulating layers 15 and 17 in such a state that it is flat and also in uniformly thin film and is in a large area over the whole region of the wafer. Thus, a first-sheet semiconductor article having the SOI structure is obtained (in the first round).

On the first substrate (single-crystal substrate) 11 side having come to have a structure of porous body 13B/epitaxial growth layer 12/single-crystal substrate 11, the residual porous body 13B is selectively removed.

Only the porous body 13B is removed by electroless wet chemical etching by the use of at least one of hydrofluoric acid, a mixture solution prepared by adding at least one of an alcohol and hydrogen peroxide water to hydrofluoric acid, buffered hydrofluoric acid, and a mixture solution prepared by adding at least one of an alcohol and hydrogen peroxide water to buffered hydrofluoric acid. Thus a structure of epitaxial growth layer 12/single-crystal substrate 11 is obtained (FIG. 1J).

Figure 1J:
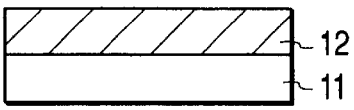
Figure 1K:
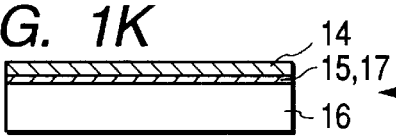

As shown in FIG. 1J, the surface of the epitaxial growth layer 12 standing rough as a result of the removal of the residual porous body 13B is subjected to heat treatment in a reducing atmosphere containing hydrogen to flaten and smooth the surface of the epitaxial growth layer 12. The epitaxial growth layer 12 thus smoothed and the first substrate 11 are again used as the substrate having the structure of epitaxial growth layer 12/single-crystal substrate 11. In place of the etching or hydrogen annealing, the removal of the porous body 13B and the smoothing may be carried out by polishing.

Subsequently, the second-round steps shown in FIGS. 1C to 1K are carried out to obtain a second-sheet semiconductor article having the SOI structure.

As described previously, in the step shown in FIG. 1B, the epitaxial growth layer having relatively a large thickness has been kept formed, and hence the substrate 11 having passed through the step shown in FIG. 1J can be moved to the step shown in FIG. 1C, without making any additional epitaxial growth. Here, the remaining epitaxial growth layer 12 has a thickness te sufficiently larger than the thickness tps for the next step of making porous.

In a commercially available batch type epitaxial growth system, it takes, e.g., a substrate carry-in time, a temperature-raising time, an actual epitaxial growth time, a temperature-dropping time and a substrate carry-out time.

According to the present embodiment of the invention, at the time of the first-round epitaxial growth the epitaxial growth layer is formed in a thickness also covering for the portion of the epitaxial growth layer to be consumed in the second round. Hence, the substrate carry-in time, temperature-raising time, temperature-dropping time and substrate carry-out time can be saved for the portion of one round.

The epitaxial growth layer 12 may also be formed in one time in a thickness covering for the portion of three or more rounds. This makes it possible to lessen the history of high temperature the substrate receives at the time of the formation of epitaxial growth layers 12 and also to lessen the number of steps, to achieve a cost reduction.

Now, as methods of dividing the bonded structure without breaking both the first substrate single-crystal substrate 11 and the second substrate supporting substrate, the following methods may be employed.

One of them is a method in which the both substrates are pulled in the direction crossing the bonded surface.

Figure 2A:
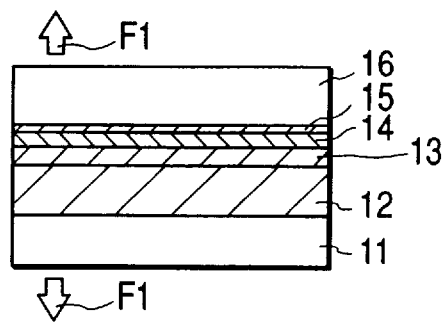
FIGS. 2A, 2B, 2C and 2D illustrate methods of dividing the bonded structure, used in the present invention.

This may be a method in which as shown in FIG. 2A an external force F1 is applied (up and down as viewed in the drawing) to the edges of the substrates to divide the bonded structure. In this case, the bonded structure is cracked on at the porous layer from its edge face toward the interior.

Figure 2B:
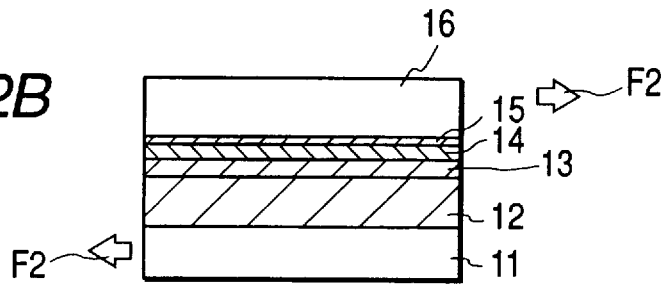

Also available are a method in which a shear stress is applied in parallel to the bonded surface, stated specifically, a method in which the respective substrates are moved in the direction opposite to each other at the plane parallel to the bonded surface or a method in which the respective substrates are turned in the opposite directions. As shown in FIG. 2B, an external force F2 may be applied (right and left as viewed in the drawing).

Alternatively, a method may be used in which a pressure is applied in the direction crossing the bonded surface to cause the porous layer to crush. This case may be understood that the direction of the external force F1 shown in FIG. 2A is in reverse.

Figure 2C:
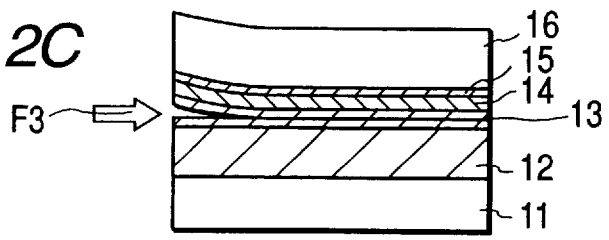

Still alternatively, as shown in FIG. 2C, a dividing energy F3 may be applied to an edge face of the porous layer. Stated specifically, a sharp blade may be inserted or a high-pressure fluid may be jetted thereto, whereby the bonded structure can be divided at the porous layer from its edge face. Also, the porous layer may be thermally oxidized from its edge face to cause it to undergo volume expansion to divide the bonded structure at the porous layer from the edge face. Still also, a substrate comprised of a flexible film may be used as the substrate 16, and this may be so pulled as to be bent, whereby the bonded structure can be divided at the porous layer from its edge face.

Dividing methods usable in the present invention are disclosed in detail in U.S. Pat. No. 5,856,229 and U.S. Pat. No. 5,854,123 and Japanese Patent Applications Laid-Open No. 9-237884, No. 10-233352 and No. 11-45840.

The bonded structure may also be divided by a method in which the porous layer that functions as a dividing region is selectively etched from the side face of the bonded structure to divide the bonded structure.

Figure 2D:
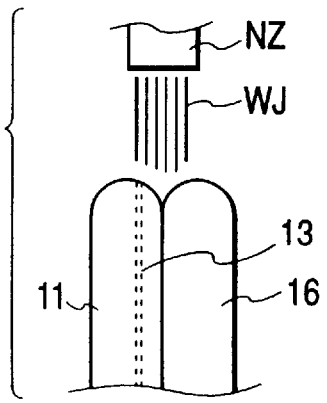

Another method is shown in FIG. 2D, which is a method in which a fluid, e.g., a liquid such as water or pure water or a gas such as air, oxygen, hydrogen, carbon dioxide or an inert gas is jetted to an edge face of the bonded structure. Reference symbol NZ denotes a fluid jet nozzle; WJ, the fluid. The bonded structure is divided into two parts by jetting the fluid to a recess formed between substrates 11 and 16 having been beveled.

The first substrate thus separated, on the surface of which the epitaxial growth layer has previously been formed in a thickness at least n-times ($n \geq 2$) the thickness of porous semiconductor layer that is necessary for the dividing, can be used again as the first substrate by smoothing its surface in the surface-smoothing step.

Namely, where the thickness of a dividing region (the porous layer) from its surface in the epitaxial growth layer is represented by tps and the thickness of the epitaxial growth layer formed on the first substrate by te, the thickness te is set to be $te \geq n \cdot tps$ ($n \geq 2$), to make it possible to pass the step of dividing the bonded structure in a plurality of number of times after the epitaxial growth layer is deposited once. Thus, the steps of:

1. forming the epitaxial growth layer on the surface of the first substrate;
2. dividing the bonded structure;
3. smoothing the roughed surface of the first substrate after the dividing; and
4. forming an epitaxial growth layer on the surface of the first substrate;

required when the first substrate is reused in the conventional process can be made to be the steps of:

1. forming the epitaxial growth layer on the surface of the first substrate in a thickness for the portion of dividing n-times;
2. dividing the bonded structure; and
3. smoothing the roughed surface of the first substrate after the dividing.

In the case where the commercially available batch type epitaxial growth system is used to form the epitaxial growth layer, in forming the epitaxial growth layer once, the steps of:

raising temperature;

carrying out epitaxial growth;

dropping temperature; and so forth;

are provided after the substrate is put into the chamber.

Accordingly, the one-time formation of the epitaxial growth layer in the thickness for the portion of the dividing in a plurality of number of times brings about the effect of lessening the history of high temperature the substrate receives and makes it possible to lessen the number of steps, to achieve a cost reduction.

Where the epitaxial growth layer has come to have a thickness te of te<n·tpx (n≧2) after two or more rounds of the dividing steps, the epitaxial growth layer may be formed again on the first substrate so as to have the thickness of te≧tpx (n≧2). Thus it becomes possible to use the first substrate as the one on the surface of which the epitaxial growth layer has been formed which can be passed again through the dividing step in a plurality of number of times.

In the conventional process, the structure of the porous layer formed at the surface of the first substrate relates closely to the number of stacking faults brought into the non-porous single-crystal semiconductor film formed on the porous layer. Accordingly, in order to control the structure of the porous layer, the specific resistance of the first substrate must be controlled.

However, the formation of the epitaxial growth layer on the first substrate enables the epitaxial growth layer to be used as the first substrate. In such an epitaxial growth layer, specific resistance can be very strictly controlled by controlling impurities during the crystal growth, and this is a very effective means for controlling the porous structure.

In addition, the structure of the porous layer is controlled by the specific resistance of the epitaxial growth layer formed on the surface of the first substrate, and hence it becomes unnecessary to select the type of the first substrate on which the epitaxial growth layer is to be formed.

From the foregoing, it after all follows that the underlying first substrate may be of any types as long as an epitaxial growth layer having any desired specific resistance can be formed thereon. Stated specifically, this means that, although a p$^+$-type high-grade substrate is conventionally used as the first substrate, any of a p$^+$-type low-grade substrate, a p$^-$-type low-grade substrate, an n$^+$-type low-grade substrate, an n$^-$-type low-grade substrate, a p$^-$-type high-grade substrate, an n$^+$-type high-grade substrate and even an n$^-$-type high-grade substrate can be used as the first substrate.

The structure of the porous layer formed at the surface of the first substrate also relates closely to the number of stacking faults brought into the non-porous single-crystal semiconductor film formed on the porous layer and to the structure of the high-porosity layer used in the dividing of the bonded structure. In the case of usual CZ substrates, in the ingot, its specific resistance is 0.01 to 0.02 Ω·cm, which is seen to be uneven by as much as ±50%.

Such uneven specific resistance makes it difficult to control the porous structure formed at the surface of the first substrate to lead to uneven density of stacking faults in the epitaxial growth layer, and, in respect of the structure of the high-porosity layer used in the dividing of the bonded structure, to an uneven dividing step, resulting in a lack in stability to make its control very difficult.

Accordingly, the use of the epitaxial growth layer as the first substrate enables very strict control of the specific resistance of the single-crystal layer by controlling impurities during the crystal growth. Hence, the structure of the porous layer can be controlled very stably.

In order to control the structure of the porous layer in the epitaxial growth layer, it is preferable to use a p$^+$- or n$^+$-type layer as the epitaxial growth layer formed on the surface of the first-substrate surface. Also, in CZ substrates commonly used, swirls and COP are present. Where substrates having COP are used in the manufacture of SOI wafers, this COP, when present in the SOI layer, leads to the formation of defects called HF defects.

Silicon is not present at the part of HF defects, and hence such defects are fatal for SOI substrates. Also, in epitaxial growth layers formed by CVD or the like, it becomes possible to control the specific resistance in a very high precision of ±5% as in-plane unevenness and ±7% as interwafer unevenness in respect of commercially available ones, and any swirls are not present which are caused by uneven impurity density and are seen in CZ substrates. Hence, when the porous layer is formed, the thickness distribution of the porous layer can be made more highly uniform.

Thus, the use of the epitaxial growth layer as the first substrate can make the substrate free of any defects considered to be caused by swirls or COP present in CZ substrates, and hence any defects brought into wafers when SOI wafers are produced can greatly be reduced.

The process of such epitaxial growth requires a large number of steps and besides takes a time. This has been a problem in respect of production tact or production cost. However, the employment of the present invention described above can solve the above problem.

Examples of the present invention will be described below with reference to the drawings.

EXAMPLE 1

A process for producing an SOI substrate according to the present Example is described here, again with reference to FIGS. 1A to 1K.

Using as the first substrate a p-type (100) single-crystal silicon substrate 11 (FIG. 1A) of 8 inches diameter with a specific resistance of 0.01 Ω·cm, having a thickness of 725 μm, an epitaxial layer p-type single-crystal silicon with a specific resistance of 0.01 Ω·cm was grown thereon by CVD (chemical vapor deposition) to form a layer (epitaxial silicon layer) 12 of 30 μm thick (FIG. 1B). Growth conditions were as follows:

Source gases: $SiHCl_3/H_2$
Dopant: $B_2H_6$
Gas pressure: 760 Torr (about $1.0 \times 10^5$ Pa)
Temperature: 1,080° C.
Growth rate: 2 μm/min.

The epitaxial silicon layer 12 formed on the surface of the first substrate was subjected to anodization in an aqueous HF (hydrogen fluoride) solution. Thus, a porous silicon layer 13 of 11 μm thick was formed at the surface of the p-type single-crystal epitaxial silicon layer 12 (FIG. 1C). Anodization conditions were as follows:

Current density: 5 mA/cm$^{-2}$
Anodizing solution: $HF:H_2O:C_2H_5OH=1:1:1$
Time: 11 minutes
Thickness of porous layer: 11 μm
Porosity: 20%

This substrate was oxidized at 400° C. for 1 hour in an atmosphere of oxygen. As a result of this oxidation, the inner walls of pores in the porous silicon layer (porous semiconductor layer) 13 were covered with thermal oxide films. Thereafter, this was immersed in an aqueous HF solution with an HF concentration of 1.2% by weight for 30 seconds to remove the thermal oxide film present on the porous silicon layer 13, followed by thorough water washing and then thorough drying. The resultant substrate was set in an epitaxial growth apparatus. After the temperature was raised in an atmosphere of hydrogen, single-crystal silicon was epitaxially grown on the porous silicon layer 13 by CVD to form a layer 14 of 1,045 nm thick (FIG. 1D). Growth conditions were as follows:

Source gases: $SiH_2Cl_2/H_2$
Gas flow rate: 0.1/25 l/min.
Gas pressure: 760 Torr (about $1.0\times10^5$ Pa)
Temperature: 950° C.
Growth rate: 0.2 µm/min.

On the surface of the single-crystal silicon layer 14 thus formed, an $SiO_2$ layer 15 of 100 nm thick was further formed as an insulating layer by thermal oxidation (FIG. 1E). The surface of a silicon substrate 16 on which a 500 nm thick $SiO_2$ layer 17 (an insulating layer) had been formed (FIG. 1F), prepared separately as the second substrate, and the surface of the $SiO_2$ layer 15 were face to face brought into contact, followed by heat treatment at 1,100° C. for 2 hours to effect bonding (FIG. 1G).

To the bonded structure thus obtained, a sufficient tensile force was applied in the direction vertical to its surfaces, so that the porous silicon layer 13 was broken and the bonded structure was divided into two parts, thus the porous silicon was uncovered (FIG. 1H).

Stated specifically, to both sides of the bonded structure, plates were attached with an adhesive and the plates were set to a jig movable in the direction where they were pulled apart from each other, and thereafter the bonded structure was thereby divided into two parts. Thereafter, the porous silicon layer 13 was selectively etched using an etchant 1:5 mixture solution of hydrofluoric acid with an HF concentration of 49% by weight and hydrogen peroxide water with an $H_2O_2$ concentration of 30% by weight while stirring the solution.

The single-crystal silicon remained without being etched, and the porous silicon was selectively etched, the single-crystal silicon serving as an etching stopper, and was completely removed. Thus a first-sheet SOI substrate was obtained (FIG. 1K).

The etch rate of the non-porous silicon with respect to the etchant was very low, and its selectivity ratio to the etch rate of the porous layer reached as high as $10^5$ or above. Thus, the amount of etching (about few nanometers) in the etching of the non-porous single-crystal silicon layer 14 was a film thickness loss negligible in practical use. More specifically, a single-crystal silicon layer 14 having a thickness of 1 µm was able to be formed on the insulating layer consisting of the $SiO_2$ layers 15 and 17. The single-crystal silicon layer 14 did not show any change as a result of the selective etching of the porous silicon.

Cross-sectional observation with a transmission electron microscope ascertained that any new crystal defects were not brought into the silicon layer and a good crystal structure was maintained. This substrate was immersed in an aqueous HF solution with an HF concentration of as high as from 40% by weight to 49% by weight for 15 minutes and thereafter the whole substrate surface was observed with an optical microscope to find that the part where a hole due to HF was made in the buried oxide film was at only one spot.

Namely, since the substrate comprising the first substrate 11 on the surface of which the epitaxial silicon layer 12 was formed was used, an SOI substrate having high-quality semiconductor layer was obtained which was COP-free in an HF defects test compared with SOI substrates produced using conventional CZ substrates. Incidentally, like results were obtained also when the substrate was bonded without forming the oxide film 15 on the surface of the single-crystal silicon layer 14. Also, like results were obtained also when the substrate was bonded without forming the oxide film 17 on the surface of the silicon substrate 16.

Meanwhile, after the porous silicon layer 13 remaining on the side of the single-crystal silicon substrate 11 separated at the porous silicon layer 13 was removed by like etching (FIG. 1I), the resultant substrate was subjected to heat treatment (hydrogen annealing) in a hydrogen-containing reducing atmosphere in order to smooth the surface having roughed as a result of the etching (FIG. 1J). Heat treatment conditions were as follows:

Temperature: 1,100° C.
Time: 1 hour
Source gas: $H_2$
Gas flow rate: 10 l/min.
Gas pressure: 760 Torr (about $1.0\times10^5$ Pa)

In the hydrogen annealing, migration of surface atoms occurs so as to lower the surface energy, and hence the surface having roughed as a result of selective etching was able to be made flat and smooth. In evaluation made on an atomic force microscope, the average square roughness in regions of 50 µm square was 0.2 nm, and was able to be equal to or better than that of usually commercially available polished silicon substrates.

Using the first substrate 11 having the epitaxial silicon layer 12 thus obtained, having a remaining thickness of about 19 µm, the step of forming the porous silicon layer 13 and subsequent steps were repeated to obtain a second-sheet SOI substrate having a high-quality semiconductor layer.

Then, since the epitaxial silicon layer 12 came to about 8 µm thick, single-crystal silicon was grown thereon by CVD to make the epitaxial silicon layer 12 again have the layer thickness of 30 µm, and the step of forming the porous layer and subsequent steps were repeated to obtain a third-sheet SOI substrate having a high-quality semiconductor layer. The step of forming the porous layer and subsequent steps were further repeated to obtain a fourth-sheet SOI substrate having a high-quality semiconductor layer.

EXAMPLE 2

A process for producing an SOI substrate according to the present Example is described here, again with reference to FIGS. 1A to 1K.

A p-type (100) single-crystal silicon substrate 11 (FIG. 1A) of 6 inches diameter with a specific resistance of 0.01 Ω·cm, having a thickness of 625 µm was prepared, and was set in an epitaxial growth apparatus. After the temperature was raised in an atmosphere of hydrogen, a p-type single-crystal silicon with a specific resistance of 0.05 Ω·cm was grown on the substrate 11 by CVD to form a layer (epitaxial silicon layer) 12 of 40 µm thick (FIG. 1B). Growth conditions were as follows:

Source gases: $SiHCl_3/H_2$
Dopant: $B_2H_6$
Gas pressure: 760 Torr (about $1.0\times10^5$ Pa)
Temperature: 1,080° C.
Growth rate: 2 µm/min.

The surface of the epitaxial silicon layer on the substrate 11 was subjected to anodization in an aqueous HF solution. Thus, a porous silicon layer 13 of 8 µm thick was formed (FIG. 1C). Anodization conditions were as follows:

Current density: 5 mA/$cm^{-2}$
Anodizing solution: $HF:H_2O:C_2H_5OH=1:1:1$
Time: 10 minutes
Thickness of porous silicon layer: 8 µm
Porosity: 30%

This substrate was oxidized at 400° C. for 1 hour in an atmosphere of oxygen. As a result of this oxidation, the inner walls of pores in the porous silicon layer 13 were covered with thermal oxide films. Thereafter, this was immersed in an aqueous HF solution with an HF concentration of 1.0% by weight for 45 seconds to remove the thermal oxide film present on the porous silicon layer 13, followed by thorough water washing and then thorough drying. The resultant substrate was set in an epitaxial growth apparatus. After the temperature was raised in an atmosphere of hydrogen, single-crystal silicon was epitaxially grown on the porous silicon layer 13 by CVD to form a layer 14 of 1,045 nm thick (FIG. 1D). Growth conditions were as follows:

Source gases: $SiH_2Cl_2/H_2$
Gas flow rate: 0.5/180 l/min.
Gas pressure: 80 Torr (about $1.1 \times 10^4$ Pa)
Temperature: 950° C.
Growth rate: 0.3 μm/min.

On the surface of the single-crystal silicon layer 14 thus formed, an $SiO_2$ layer 15 of 100 nm thick was further formed by thermal oxidation (FIG. 1E). The surface of a silicon substrate 16 on which a 500 nm thick $SiO_2$ layer 17 had been formed (FIG. 1F), prepared separately, and the surface of the $SiO_2$ layer 15 were face to face brought into contact, followed by heat treatment at 900° C. for 2 hours to effect bonding (FIG. 1G). Here, before these are face to face brought into contact, the bonding surfaces may be subjected to pretreatment such as N2 plasma treatment to improve bond strength.

The bonded structure thus obtained was set upright as shown in FIG. 2D, and high-pressure pure water was jetted to a crevice (a recess) formed by beveling both wafers. It was jetted in the direction parallel to the bonded interface (surface) of the bonded structure and at a pressure of 2,000 kgf/cm² from a nozzle of 0.15 mm diameter of a water jet assembly provided at its upper part. In that course, the nozzle was scanned in the direction where the high-pressure pure water moves along the crevice formed by beveling.

As a result, the bonded structure was divided into two parts at the interior of the porous silicon layer 13 formed by anodization (FIG. 1H). Thus, the $SiO_2$ layer 15, the single-crystal silicon layer 14 and part of the porous silicon layer 13 were transferred to the silicon substrate 16 bonded. Only the porous silicon layer 13 remained on the surface of the epitaxial silicon layer 12.

Thereafter, the porous silicon layer 13 was selectively etched using a 1:5 mixture solution of hydrofluoric acid with an HF concentration of 49% by weight and hydrogen peroxide water with an $H_2O_2$ concentration of 30% by weight while stirring the solution. The single-crystal silicon remained without being etched, and the porous silicon was selectively etched, the single-crystal silicon serving as an etching stopper, and was completely removed. Thus a first-sheet SOI substrate was obtained (FIG. 1K).

More specifically, a single-crystal silicon layer 14 having a thickness of 1 μm was able to be formed on the insulating layer consisting of the $SiO_2$ layers 15 and 17. The single-crystal silicon layer 14 did not show any change as a result of the selective etching of the porous silicon.

Cross-sectional observation with a transmission electron microscope ascertained that any new crystal defects were not brought into the silicon layer and a good crystal structure was maintained. This substrate was immersed in an aqueous high-concentration HF solution for 15 minutes and thereafter the whole substrate surface was observed with an optical microscope to find that the part where a hole due to HF was made in the buried oxide film was at only one spot.

Namely, since the substrate comprising the single-crystal silicon substrate 11 on the surface of which the epitaxial silicon layer 12 was formed was used, an SOI substrate having high-quality semiconductor layer was obtained which was swirless and was COP-free in an HF defects test compared with SOI substrates produced using conventional CZ substrates.

Meanwhile, after the porous silicon layer 13B remaining on the side of the single-crystal silicon substrate 11 separated at the porous silicon layer 13B was removed by like etching (FIG. 1I), the surface having roughed as a result of the etching was removed by polishing to 5 μm depth to smooth the rough surface (FIG. 1J). This smoothing enabled the substrate surface to have substantially the same surface flatness as commercially available polished silicon substrates.

Using the substrate 11 having the epitaxial silicon layer 12 thus obtained, having a remaining thickness of about 32 μm, the step of forming the porous silicon layer 13 and subsequent steps were repeated to obtain a second-sheet SOI substrate having a high-quality semiconductor layer.

Then, on an epitaxial silicon layer 12 having a remaining thickness of about 24 μm, the like steps were repeated to obtain a third-sheet SOI substrate. Then, on an epitaxial silicon layer 12 having a remaining thickness of about 16 μm, the like steps were further repeated to obtain a fourth-sheet SOI substrate. Then, on an epitaxial silicon layer 12 having a remaining thickness of about 8 μm, the like steps were still further repeated to obtain a fifth-sheet SOI substrate.

Where the epitaxial silicon layer 12 has come to have a thickness smaller than 8 μm after the polishing, single-crystal silicon for the portion corresponding to the epitaxial silicon layer 12 consumed may be grown thereon by CVD to make the epitaxial silicon layer 12 again have the layer thickness of 40 μm, and the step of forming the porous silicon layer and subsequent steps may be repeated to obtain additional first- to fifth-sheet SOI substrates having high-quality semiconductor layers.

EXAMPLE 3

A process for producing an SOI substrate according to the present Example is described here with reference to FIGS. 3A to 3K.

On a p-type first (100) single-crystal silicon substrate 51 (FIG. 3A) of 6 inches diameter with a specific resistance of 0.01 Ω·cm, having a thickness of 625 μm, a p-type single-crystal silicon with a specific resistance of 0.01 Ω·cm was grown by CVD to form a layer (epitaxial silicon layer) 52 of 30 μm thick (FIG. 3B). Growth conditions were as follows:

Source gases: $SiHCl_3/H_2$
Dopant: $B_2H_6$
Gas pressure: 760 Torr (about $1.0 \times 10^5$ Pa)
Temperature: 1,080° C.
Growth rate: 2 μm/min.

The surface of the epitaxial silicon layer 52 formed on the surface of the substrate 51 was subjected to anodization in an aqueous HF solution under first conditions and thereafter to anodization under second conditions. Thus, a plurality of porous silicon layers 53 were formed (FIG. 3C). Anodization conditions were as follows:

First conditions
Current density: 7 mA/cm$^{-2}$
Anodizing solution: $HF:H_2O:C_2H_5OH=1:1:1$
Time: 5 minutes
Thickness of porous silicon layer 53': 4.5 μm
Porosity: 15%

Second conditions

Current density: 30 mA/cm$^{-2}$

Anodizing solution: HF:H$_2$O:C$_2$H$_5$OH=1:1:1

Time: 10 seconds

Thickness of porous silicon layer 53": 0.2 μm

Porosity: 40% As the porous silicon layer 53 was formed in double-layer construction, the surface layer of porous silicon layer 53' formed previously by low-current anodization was formed as a layer on which a high-quality epitaxial silicon layer was to be formed, and the lower layer of porous silicon layer 53" formed later by high-current anodization was formed as a layer for providing an actual dividing layer. Accordingly, the thickness of the low-current porous silicon layer 53' is not limited to the above, and the thickness may range from hundreds of μm to about 0.1 μm. A third layer and further layers may also be kept formed after the formation of the second-layer porous silicon layer 53".

This substrate was oxidized at 400° C. for 1 hour in an atmosphere of oxygen. As a result of this oxidation, the inner walls of pores in the porous silicon formed at the surface of the epitaxial silicon were covered with thermal oxide films. Thereafter, this was immersed in an aqueous HF solution with an HF concentration of 1.0% by weight for 45 seconds, followed by thorough water washing and then thorough drying. The resultant substrate was set in an epitaxial growth apparatus. After the temperature was raised in an atmosphere of hydrogen, single-crystal silicon layer 54 of 1,045 nm thick was epitaxially grown on the porous silicon by CVD (FIG. 3D). Growth conditions were as follows:

Source gases: SiH$_2$Cl$_2$/H$_2$

Gas flow rate: 0.5/180 l/min.

Gas pressure: 80 Torr (about 1.1×10$^4$ Pa)

Temperature: 950° C.

Growth rate: 0.3 μm/min.

On the surface of the single-crystal silicon layer 54 thus formed, an SiO$_2$ layer 55 of 100 nm thick was further formed by thermal oxidation (FIG. 3E). The surface of a silicon substrate 56 on which a 100 nm thick SiO$_2$ layer 57 had been formed (FIG. 3F), prepared separately, and the surface of the SiO$_2$ layer 55 were face to face brought into contact, followed by heat treatment at 900° C. for 2 hours to effect bonding to the second, silicon substrate 56 (FIG. 3G).

The bonded structure thus obtained was set upright as shown in FIG. 2D, and high-pressure pure water was jetted to a crevice formed by beveling both wafers. It was jetted in the direction parallel to the bonded interface (surface) of the bonded structure and at a pressure of 2,000 kgf/cm$^2$ from a nozzle of 0.15 mm diameter of a water jet assembly provided at its upper part. In that course, the nozzle was scanned in the direction where the high-pressure pure water moves along the crevice formed by beveling.

As a result, the bonded structure was cracked at the high-current anodization porous silicon layer 53" in the vicinity of its interface with the porous silicon layer 53', and was divided into two parts (FIG. 3H). Thus, the SiO$_2$ layer 55, the single-crystal silicon layer 54 and the porous silicon layers 53' and part of 53" which had originally been formed on the surface of the substrate 51 were transferred to the second, silicon substrate 56 bonded. Only the porous silicon layer 53" remained on the side of the first substrate 51.

Thereafter, the porous silicon layers 53' and part of 53" were selectively etched using a 1:5 mixture solution of hydrofluoric acid with an HF concentration of 49% by weight and hydrogen peroxide water with an H$_2$O$_2$ concentration of 30% by weight while stirring the solution. The single-crystal silicon remained without being etched, and the porous silicon was selectively etched, the single-crystal silicon serving as an etching stopper, and was completely removed. Thus a first-sheet SOI substrate was obtained (FIG. 3K).

More specifically, a single-crystal silicon layer 54 having a thickness of 1 μm was able to be formed on the SiO$_2$ layer. The single-crystal silicon layer 54 did not show any change as a result of the selective etching of the porous silicon.

Cross-sectional observation with a transmission electron microscope ascertained that any new crystal defects were not brought into the silicon layer and a good crystal structure was maintained. This substrate was immersed in an aqueous high-concentration HF solution for 15 minutes and thereafter the whole substrate surface was observed with an optical microscope to find that the part where a hole due to HF was made in the buried oxide film was at only one spot.

Namely, since the substrate comprising the single-crystal silicon substrate 51 on the surface of which the epitaxial silicon layer 52 was formed was used, an SOI substrate having high-quality semiconductor layer was obtained which was swirlless and was COP-free in an HF defects test compared with SOI substrates produced using conventional CZ substrates.

Meanwhile, after the porous silicon layer 53" remaining on the side of the single-crystal silicon substrate 51 separated along the boundary of the porous silicon layer 53" was removed by like etching (FIG. 3I), the resultant substrate was subjected to heat treatment in a hydrogen-containing reducing atmosphere in order to smooth the surface having roughed as a result of the etching (FIG. 3J). Heat treatment conditions were as follows:

Temperature: 1,100° C.

Time: 1 hour

Source gas: H$_2$

Gas flow rate: 10 l/min.

Gas pressure: 760 Torr (about 1.0×10$^5$ Pa)

In evaluation made on an atomic force microscope, the average square roughness in regions of 50 μm square was 0.2 nm, and was able to be equal to or better than that of usually commercially available polished silicon substrates.

In the case where the SOI substrate was produced by superposing the single-crystal silicon layer 54 on the substrate where the porous layer 53 was formed, any swirls were not seen also after the heat treatment made in a hydrogen-containing reducing atmosphere in order to smooth the surface having roughed as a result of the etching, and a good state of bonding was achieved.

Using the substrate 51 having the epitaxial silicon layer 52 thus obtained, the step of forming the porous layer 53 and subsequent steps were repeated by further five rounds to obtain six SOI substrates in total, having high-quality semiconductor layers.

Then, where the epitaxial silicon layer 52 has come to have a thickness smaller than 5.2 μm, the epitaxial silicon layer 52 may be made to again have the layer thickness of 30 μm by effecting CVD, and the step of forming the porous layer and subsequent steps may be repeated to obtain additional six SOI substrates having high-quality semiconductor layers.

EXAMPLE 4

A process for producing an SOI substrate according to the present Example is described here with reference to FIGS. 3A to 3K.

On an n-type first (100) single-crystal silicon substrate 51 (FIG. 3A) of 4 inches diameter with a specific resistance of 0.01 Ω·cm, having a thickness of 525 μm, an n-type single-crystal silicon with a specific resistance of 0.01 Ω·cm was grown by CVD to form a layer (epitaxial silicon layer) 52 of 30 μm thick (FIG. 3B). Growth conditions were as follows:

Source gases: $SiHCl_3/H_2$
Dopant: $PH_3$
Gas pressure: 760 Torr (about $1.0 \times 10^5$ Pa)
Temperature: 1,080° C.
Growth rate: 2 μm/min.

The surface of the epitaxial silicon layer 52 formed on the substrate 51 was subjected to anodization in an aqueous HF solution under first conditions and thereafter to anodization under second conditions. Thus, a plurality of porous silicon layers 53 were formed (FIG. 3C). Anodization conditions were as follows:

First conditions
Current density: 7 mA/cm²
Anodizing solution: $HF:H_2O:C_2H_5OH=1:1:1$
Time: 5 minutes
Thickness of porous silicon layer 53': 4.5 μm
Porosity: 15%
Second conditions
Current density: 30 mA/cm$^{-2}$
Anodizing solution: $HF:H_2O:C_2H_5O=1:1:1$
Time: 10 seconds
Thickness of porous silicon layer 53": 0.2 μm
Porosity: 40%

This substrate was oxidized at 400° C. for 1 hour in an atmosphere of oxygen. As a result of this oxidation, the inner walls of pores in the porous silicon formed at the surface of the epitaxial silicon were covered with thermal oxide films. Thereafter, this was immersed in an aqueous HF solution with an HF concentration of 1.0% by weight for 45 seconds, followed by thorough water washing and then thorough drying. The resultant substrate was set in an epitaxial growth apparatus, and single-crystal silicon layer 54 of 1,045 nm thick was epitaxially grown on the porous silicon layer 53 by CVD (FIG. 3D). Growth conditions were as follows:

Source gases: $SiH_2Cl_2/H_2$
Gas flow rate: 0.5/180 l/min.
Gas pressure: 80 Torr (about $1.1 \times 10^4$ Pa)
Temperature: 950° C.
Growth rate: 0.3 μm/min.

On the surface of the single-crystal silicon layer 54 thus formed, an $SiO_2$ layer 55 of 100 nm thick was further formed by thermal oxidation (FIG. 3E). The surface of a silicon substrate 56 on which a 500 nm thick $SiO_2$ layer 57 had been formed (FIG. 3F), prepared separately, and the surface of the $SiO_2$ layer 55 were face to face brought into contact, followed by heat treatment at 900° C. for 2 hours to effect bonding to the second, silicon substrate 56 (FIG. 3G).

The bonded structure thus obtained was set upright as shown in FIG. 2D, and high-pressure pure water was jetted to a crevice formed by beveling both wafers. It was jetted in the direction parallel to the bonded interface (surface) of the bonded structure and at a pressure of 2,000 kgf/cm² from a nozzle of 0.15 mm diameter of a water jet assembly provided at its upper part. In that course, the nozzle was scanned in the direction where the high-pressure pure water moves along the crevice formed by beveling.

As a result, the bonded structure was cracked at the high-current anodization porous silicon layer 53" along its interface with the porous silicon layer 53', and was divided into two parts (FIG. 3H). Thus, the $SiO_2$ layer 55, the single-crystal silicon layer 54 and the porous silicon layers 53' and part of 53" which had originally been formed on the surface of the substrate 51 were transferred to the second, silicon substrate 56 bonded. Only the porous silicon layer 53" remained on the side of the first substrate 51.

Thereafter, the porous silicon layers 53' and part of 53" were selectively etched using a 1:5 mixture solution of hydrofluoric acid with an HF concentration of 49% by weight and hydrogen peroxide water with an $H_2O_2$ concentration of 30% by weight while stirring the solution. The single-crystal silicon remained without being etched, and the porous silicon was selectively etched, the single-crystal silicon serving as an etching stopper, and was completely removed. Thus a first-sheet SOI substrate was obtained (FIG. 3K).

More specifically, a single-crystal silicon layer 54 having a thickness of 1 μm was able to be formed on the insulating layer consisting of the $SiO_2$ layers 55 and 57.

The single-crystal silicon layer 54 did not show any change as a result of the selective etching of the porous silicon. Cross-sectional observation with a transmission electron microscope ascertained that any new crystal defects were not brought into the silicon layer and a good crystal structure was maintained. This substrate was immersed in an aqueous high-concentration HF solution for 15 minutes and thereafter the whole substrate surface was observed with an optical microscope to find that the part where a hole due to HF was made in the buried oxide film was at only one spot.

Namely, since the substrate comprising the single-crystal silicon substrate 51 on the surface of which the epitaxial silicon layer 52 was formed was used, an SOI substrate having high-quality semiconductor layer was obtained which was swirless and was COP-free in an HF defects test compared with SOI substrates produced using conventional CZ substrates.

Meanwhile, after the porous silicon layer 53" remaining on the side of the single-crystal silicon substrate 51 was removed by like etching (FIG. 3I), the resultant substrate was subjected to heat treatment in a hydrogen-containing reducing atmosphere in order to smooth the surface having roughed as a result of the etching (FIG. 3J). Heat treatment conditions were as follows:

Temperature: 1,100° C.
Time: 1 hour
Source gas: $H_2$
Gas flow rate: 10 l/min.
Gas pressure: atmospheric pressure In evaluation made on an atomic force microscope, the average square roughness in regions of 50 μm square was 0.2 nm, and was able to be equal to or better than that of usually commercially available polished silicon substrates.

Using the substrate 51 having the epitaxial silicon layer 52 thus obtained, the step of forming the porous layer 53 and subsequent steps were repeated by further five rounds to obtain six SOI substrates in total, having high-quality semiconductor layers.

Thereafter, where the epitaxial silicon layer 52 came to have a thickness smaller than 5.2 μm, the epitaxial silicon layer 52 was made to again have the layer thickness of 30 μm by effecting CVD, and the step of forming the porous layer and subsequent steps may be repeated to obtain additional six SOI substrates having high-quality semiconductor layers.

COMPARATIVE EXAMPLE

An SOI substrate was produced in substantially the same manner as in Example 1 except that the step of epitaxial growth shown in FIG. 1B was omitted.

More specifically, at the surface of a usually available CZ substrate, the porous silicon layer 13 was formed without making any epitaxial growth. The single-crystal silicon layer 14 was formed on the porous silicon layer 13. The resultant single-crystal silicon substrate 11 and the silicon substrate 16 were bonded, and the bonded structure obtained was divided at the interior of the porous silicon layer 13. The porous silicon layer 13 remaining on the single-crystal silicon substrate 11 was removed. Then the surface of the substrate was subjected to heat treatment in a hydrogen-containing reducing atmosphere in order to smooth the surface having roughed as a result of the etching, where swirls were seen which were observable in differential interference of an optical microscope.

This substrate was again used as the single-crystal silicon substrate 11 to produce an SOI substrate, where faulty bonding due to swirled areas occurred very frequently in the step of bonding.

Further embodiments in which the semiconductor article production process according to Embodiment 1 of the present invention is applied will be described below.

EMBODIMENT 2

A process for producing the semiconductor article according to the present Embodiment is described here with reference to FIGS. 4A to 4K.

Figure 4A:
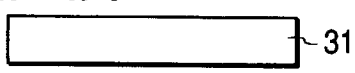
FIGS. 4A, 4B, 4C, 4D, 4E, 4F, 4G, 4H, 4I, 4J and 4K illustrate a process for producing a semiconductor article according to still another embodiment of the present invention.
Figure 4B:
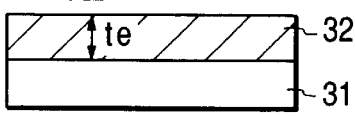

On an n-type first (100) single-crystal silicon substrate 31 (FIG. 4A) of 4 inches diameter with a specific resistance of from 0.01 Ω·cm to 100 Ω·cm, having a thickness of 525 $\mu$m, an n-type single-crystal silicon with a specific resistance of 0.01 Ω·cm is grown by LPE (liquid phase epitaxy) in a thickness of 50 $\mu$m to form a layer (epitaxial silicon layer) 32 (FIG. 4B).

Figure 4C:
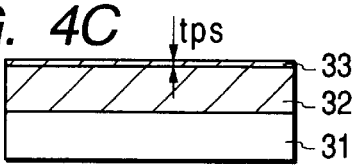

As the growth process, the single-crystal silicon substrate 31 is immersed in a 900° C. metallic solvent of indium having been dissolved to become supersaturated, followed by gradually cooling to form the single-crystal epitaxial silicon layer 32 in the thickness of 50 $\mu$m. The epitaxial silicon layer 32 thus formed on the surface of this substrate is subjected to
anodization in an aqueous HF solution. Thus, a porous silicon layer 33 of 9 $\mu$m thick is formed (FIG. 4C). Anodization conditions are as follows:

Current density: 7 mA/cm$^{-2}$

Anodizing solution: HF:H$_2$O:C$_2$H$_5$OH=1:1:1

Time: 11 minutes

Thickness of porous silicon layer: 9 $\mu$m

Porosity: 15%

Figure 4D:
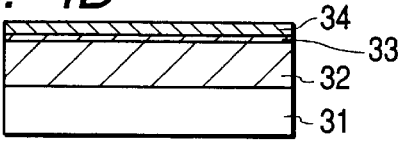

This substrate is oxidized at 400° C. for 2 hours in an atmosphere of oxygen. As a result of this oxidation, the inner walls of pores in the porous silicon layer 33 are covered with thermal oxide films. On this porous silicon layer 33, a single-crystal silicon layer 34 is epitaxially grown by MBE (molecular-beam epitaxy) in a thickness of 545 nm (FIG. 4D). Growth conditions are as follows:

Temperature: 700° C.

Pressure: 1×10$^{-9}$ Torr (about 1.3×10$^{-7}$ Pa)

Growth rate: 0.1 nm/sec.

Temperature: 950° C.

Growth rate: 0.3 $\mu$m/min.

Figure 4E:
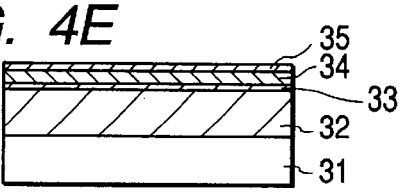
Figure 4F:
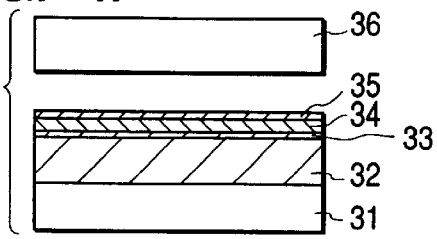
Figure 4G:
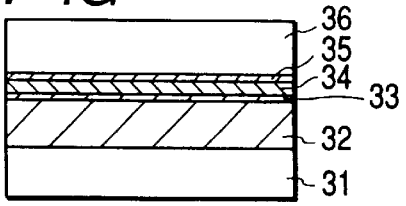

On the surface of the single-crystal silicon layer 34 thus formed, an SiO$_2$ layer 35 of 100 nm thick is further formed by thermal oxidation (FIG. 4E). The surface of a fused silica substrate 36 (FIG. 4F), prepared separately as the second substrate, and the surface of the SiO$_2$ layer 35 are face to face brought into contact, followed by heat treatment at 400° C. for 2 hours to effect bonding (FIG. 4G). Here, before these are face to face brought into contact, the bonding surfaces is subjected to pretreatment such as N2 plasma treatment.

Figure 4H:
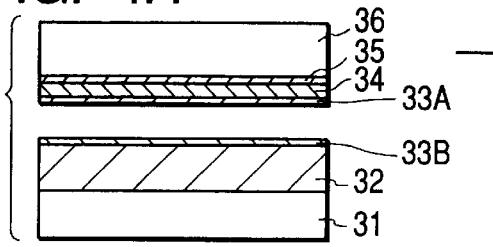

To the bonded structure thus obtained, a sufficient pressure is applied in the direction vertical to its in-plane and also uniformly in its in-plane, so that the porous silicon layer 33 is broken and the bonded structure is divided into two parts, thus the porous silicon is uncovered (FIG. 4H). Thereafter, the porous silicon layer 33 is selectively etched using a 1:5 mixture solution of buffered hydrofluoric acid and hydrogen peroxide water with an H$_2$O$_2$ concentration of 30% by weight while stirring the solution. The single-crystal silicon remains without being etched, and the porous silicon is selectively etched, the single-crystal silicon serving as an etching stopper, and is completely removed (FIG. 4K).

Thus, a first-sheet SOI substrate is obtained which comprises the fused silica substrate 36 and formed thereon via the insulating layer 35 a single-crystal silicon layer 34 having a thickness of 0.5 $\mu$m.

Since the substrate comprising the first substrate 31 on the surface of which the epitaxial silicon layer 32 is formed is used, an SOI substrate having high-quality semiconductor layer is obtained which is swirlless and is COP-free in an HF defects test compared with SOI substrates produced using conventional CZ substrates.

Figure 4I:
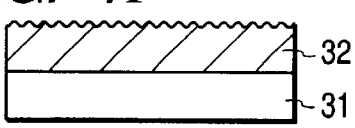
Figure 4J:
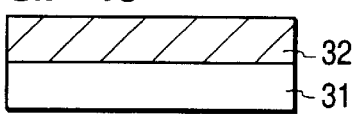
Figure 4K:
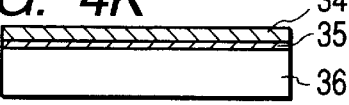

Meanwhile, the porous silicon layer 33B remaining on the side of the single-crystal silicon substrate 31 is removed by like etching (FIG. 4I). Thereafter the resultant substrate is subjected to heat treatment (hydrogen annealing) in a hydrogen-containing reducing atmosphere in order to smooth the surface having roughed as a result of the etching (FIG. 4J). Heat treatment conditions are as follows:

Temperature: 1,100° C.

Time: 2 hours

Source gas: H$_2$

Gas flow rate: 10 l/min.

Gas pressure: atmospheric pressure

In the hydrogen annealing, migration of surface atoms occurs so as to lower the surface energy, and hence the surface having roughed as a result of selective etching can be made flat and smooth. In evaluation made on an atomic force microscope, the average square roughness in regions of 50 $\mu$m square is 0.2 nm, and can be equal to or better than that of usually commercially available polished silicon substrates.

In the case where the SOI substrate is produced by superposing the epitaxial silicon layer 32 on the substrate where the porous layer 33 is formed, any swirls are not seen also after the heat treatment made in a hydrogen-containing reducing atmosphere in order to smooth the surface having roughed as a result of the etching, and a good state of bonding is achieved.

Using the substrate 31 having the epitaxial silicon layer 32 thus obtained, the step of forming the porous layer 33 and subsequent steps are repeated to obtain five SOI substrates having high-quality semiconductor layers. Then, where the epitaxial silicon layer 32 has come to have a thickness smaller than 9 $\mu$m, the epitaxial silicon layer 32 may be made to again have the layer thickness of 30 $\mu$m by growing single-crystal silicon by LPE, and the step of forming the porous layer and subsequent steps may be repeated to obtain additional five SOI substrates having high-quality semiconductor layers.

EMBODIMENT 3

A process for producing the semiconductor article according to the present Embodiment is described here with reference to FIGS. 5A to 5K.

Figure 5A:
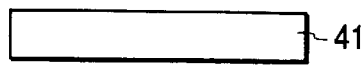
FIGS. 5A, 5B, 5C, 5D, 5F, 5G, 5H, 5I, 5J and 5K illustrate a process for producing a semiconductor article according to a further embodiment of the present invention.
Figure 5B:
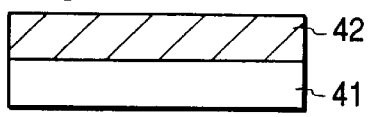

On an n-type first (100) single-crystal silicon substrate 41 (FIG. 5A) of 4 inches diameter with a specific resistance of from 0.01 Ω·cm to 100 Ω·cm, having a thickness of 525 μm, an n-type single-crystal silicon with a specific resistance of 0.05 Ω·cm is grown by MBE (molecular-beam epitaxy) to form a layer (epitaxial silicon layer) 42 of 20 μm thick (FIG. 5B). Growth conditions are as follows:

Temperature: 700° C.
Pressure: $1\times10^{-9}$ Torr (about $1.3\times10^{-7}$ Pa)
Growth rate: 0.1 nm/sec.
Temperature: 950° C.

Figure 5C:
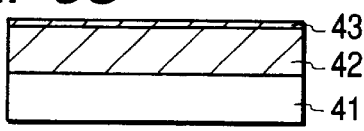

The epitaxial silicon layer 42 thus formed on the surface of this substrate is subjected to anodization in an aqueous HF solution. Thus, a porous silicon layer 43 is formed (FIG. 5C). Anodization conditions are as follows:

Current density: 7 mA/cm$^{-2}$
Anodizing solution: HF:H$_2$O:C$_2$H$_5$OH=1:1:1
Time: 5 minutes
Thickness of porous silicon layer: 5 μm
Porosity: 20%

Figure 5D:
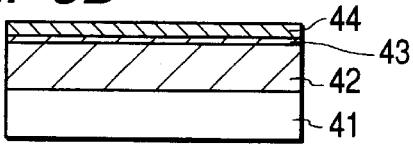
Figure 5F:
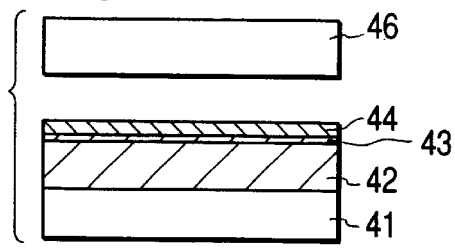

This substrate is oxidized at 400° C. for 1 hour in an atmosphere of oxygen. As a result of this oxidation, the inner walls of pores in the porous silicon layer 43 are covered with thermal oxide films. On this porous silicon layer 43, a single-crystal GaAs is epitaxially grown by MOCVD (metal organic chemical vapor deposition) to form a layer 44 of 1 μm thick (FIG. 5D). Growth conditions are as follows:

Source gases: TMG/AsH$_3$/H$_2$
Gas pressure: 80 Torr (about $1.1\times10^4$ Pa)
Temperature: 700° C.

Figure 5G:
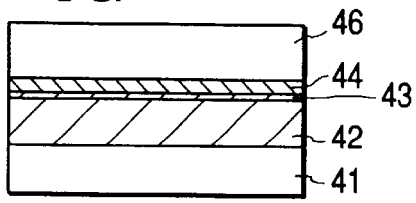

The surface of a second substrate 46 (FIG. 5F), prepared separately, and the surface of the GaAs layer 44 are face to face brought into contact, followed by heat treatment at 900° C. for 1 hour to effect bonding (FIG. 5G). As a result of this heat treatment, the both substrates are strongly bonded.

Figure 5H:
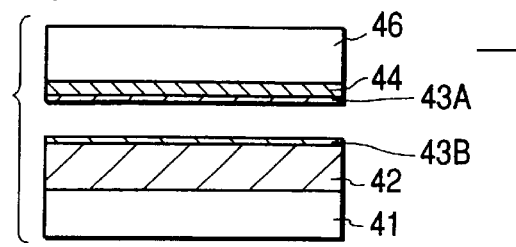

To the bonded structure thus obtained, a sufficient pressure is applied in the direction vertical to its in-plane and also uniformly in its in-plane, so that the porous silicon layer 43 is broken and the bonded structure is divided into two parts (FIG. 5H).

Thereafter, the oxide films on the pore inner walls of the remaining porous silicon layer 43 are removed, and then porous silicon layer 43A is etched using a solution of ethylenediamine, pyrocatechol and water (in a proportion of 17 ml:3 g:8 ml). The single-crystal GaAs layer 44 remains without being etched, and the porous silicon 43A is selectively etched, the single-crystal silicon serving as an etching stopper, and is completely removed. Thus a first-sheet GaAs-on-insulator substrate is obtained (FIG. 5K).

The etch rate of the single-crystal GaAs with respect to the etchant is very low, and is presumed to be in a film thickness loss negligible in practical use. More specifically, a single-crystal GaAs layer 44 having a thickness of 1 μm can be formed on the silicon substrate. The single-crystal GaAs layer 44 does not show any change as a result of the selective etching of the porous silicon layer 43.

Cross-sectional observation with a transmission electron microscope can ascertain that any new crystal defects are not brought into the GaAs layer 44 and a good crystal structure is maintained. Using such silicon substrate having the porous layer with oxide films as the supporting substrate 46, GaAs can also be formed on insulating film in the same way.

Figure 5I:
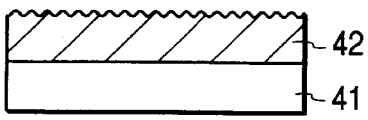
Figure 5J:
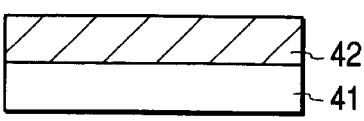
Figure 5K:
Figure 6A:
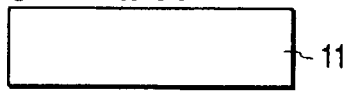
FIGS. 6A, 6B, 6C, 6D, 6E, 6F, 6G, 6H, 6I, 6J and 6K illustrate a conventional process for producing a semiconductor article.
Figure 6B:
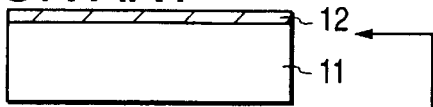
Figure 6C:
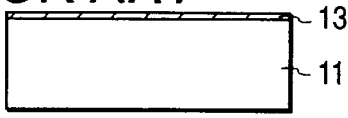
Figure 6D:
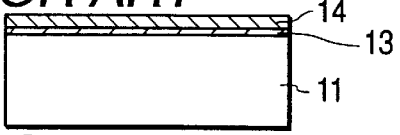
Figure 6E:
Figure 6F:
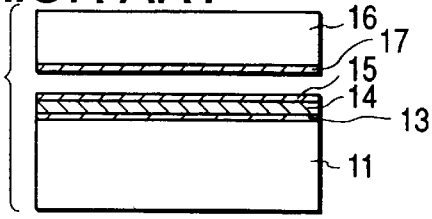
Figure 6G:
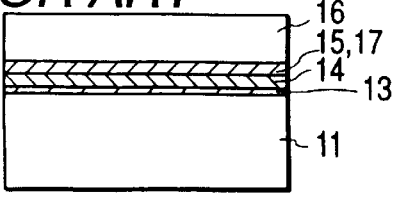
Figure 6H:
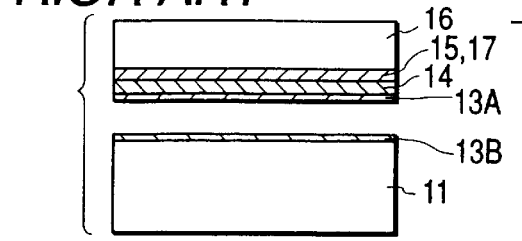
Figure 6I:
Figure 6J:
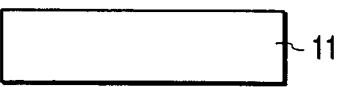
Figure 6K:
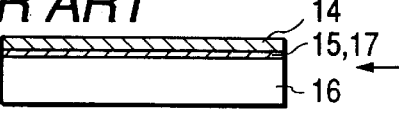

Meanwhile, the porous silicon layer 43B remaining on the side of the single-crystal silicon substrate 41 is removed by like etching (FIG. 5I). Thereafter, the resultant substrate is subjected to heat treatment in a hydrogen-containing reducing atmosphere in order to smooth the surface having roughed as a result of the etching (FIG. 5J). Heat treatment conditions are as follows:

Temperature: 1,100° C.
Time: 1 hour
Source gas: H$_2$
Gas flow rate: 10 l/min.
Gas pressure: atmospheric pressure In evaluation made on an atomic force microscope, the average square roughness in regions of 50 μm square is 0.2 nm, and can be equal to or better than that of usually commercially available polished silicon substrates.

Using the substrate 41 having the epitaxial silicon layer 42 thus obtained, the step of forming the porous layer 43 and subsequent steps are repeated to obtain three GaAs-on-insulator substrates having high-quality semiconductor layers.

Then, where the epitaxial silicon layer 42 has come to have a thickness smaller than 5 μm, the epitaxial silicon layer 42 may be made to again have the layer thickness of 20 μm by growing single-crystal silicon by MBE (molecular-beam epitaxy), and the step of forming the porous layer and subsequent steps may be repeated to obtain additional three GaAs(compound semiconductor)-on-insulator substrates having high-quality semiconductor layers.

What is claimed is:

1. A process for producing a semiconductor article, comprising the steps of:
    forming a porous semiconductor layer at at least one surface of a first substrate;
    forming a non-porous single-crystal semiconductor layer on the porous semiconductor layer;
    bonding the first substrate to a second substrate to form a bonded structure; and
    dividing the bonded structure at the porous semiconductor layer; wherein,
        the process further comprises the steps of:
            forming, before the step of forming the porous semiconductor layer, on the one surface of the first substrate an epitaxial growth layer in a thickness at least n-times (n≧2) the thickness of the porous semiconductor layer; and
            again forming a porous semiconductor layer on the epitaxial growth layer after the step of dividing the bonded structure.

2. The process for producing a semiconductor article according to claim 1, wherein the first substrate is bonded to the second substrate via an insulating layer.

3. The process for producing a semiconductor article according to claim 1, which further comprises the steps of:
    removing at least the porous semiconductor layer from the first substrate after the dividing step; and
    subjecting the surface of the first substrate from which the porous semiconductor layer has been removed, to heat treatment in a reducing atmosphere containing hydrogen to smooth the surface.

4. The process for producing a semiconductor article according to claim 1, which further comprises the steps of:

removing at least the porous semiconductor layer from the first substrate after the dividing step; and polishing the surface of the first substrate from which the porous semiconductor layer has been removed, to smooth the surface.

5. The process for producing a semiconductor article according to claim 1, wherein, where the thickness of the epitaxial growth layer is represented by te and the thickness of the porous layer by tps, epitaxial growth is effected on the epitaxial growth layer when $$te \leq n \cdot tps (n \geq 2),$$

so as to be made into $$te \geq n \cdot tps (n \geq 2).$$

6. The process for producing a semiconductor article according to any claim from claims 1 to 5, wherein porous semiconductor layers remaining on the side of the first substrate and the side of the second substrate are each removed by immersing the substrate in an etchant of hydrofluoric acid, an etchant prepared by adding at least one of an alcohol and hydrogen peroxide water to hydrofluoric acid, an etchant of buffered hydrofluoric acid, or an etchant prepared by adding at least one of an alcohol and hydrogen peroxide water to buffered hydrofluoric acid.

7. The process for producing a semiconductor article according to any claim from claims 1 to 5, wherein the bonded structure is divided by at least one means of applying a pressure in the direction vertical to the bonded surface, and applying a tensile force or shear force to each side of the bonded structure in the vertical direction.

8. The process for producing a semiconductor article according to claim 1, wherein the porous semiconductor layers remaining on the side of the first substrate and the side of the second substrate are each selectively etched with the etchant.

9. The process for producing a semiconductor article according to any claim from claims 1 to 5, wherein the porous semiconductor layer is removed by polishing while making use of the non-porous single-crystal semiconductor layer as a stopper.

10. The process for producing a semiconductor article according to any claim from claims 1 to 5, wherein the step of bonding the first substrate to the second substrate is carried out by a means selected from anodic bonding, pressing, heat treatment and a combination of any of these.

11. The process for producing a semiconductor article according to any claim from claims 1 to 5, wherein the step of forming the porous semiconductor layer is carried out by anodization.

12. The process for producing a semiconductor article according to claim 1, wherein the porous semiconductor layer comprises a plurality of layers having different porosities.

13. The process for producing a semiconductor article according to claim 12, wherein the plurality of porous semiconductor layers are formed at least in the order of a low-porosity layer and a high-porosity layer from the main surface side of the second substrate.

14. The process for producing a semiconductor article according to claim 13, wherein the low-porosity layer has a porosity lower than 30%.

15. The process for producing a semiconductor article according to claim 13, wherein the high-porosity layer has a porosity not lower than 30%.

16. The process for producing a semiconductor article according to claim 13, wherein the high-porosity layer has a thickness not larger than 5 $\mu$m.

17. The process for producing a semiconductor article according to any claim from claims 1 to 5, wherein the second substrate comprises a flexible substrate, and the porous semiconductor layer is separated by attaching the flexible film to the surface of the porous semiconductor layer and peeling the film.

18. The process for producing a semiconductor article according to any claim from claims 1 to 5, wherein the step of dividing the bonded structure is carried out by inserting a wedge to an edge face of the bonded structure.

19. The process for producing a semiconductor article according to any claim from claims 1 to 5, wherein the step of dividing the bonded structure is carried out by applying an external force to the bonded structure in the direction vertical to its surface, and pulling or pressing the bonded structure.

20. The process for producing a semiconductor article according to any claim from claims 1 to 5, wherein the step of dividing the bonded structure is carried out by oxidizing the porous semiconductor layer from an edge face of the bonded structure to cause volume expansion and inserting a wedge to an edge face of the layer.

21. A process for producing a semiconductor article, comprising the steps of:

forming on a surface of a substrate an epitaxial growth layer having a thickness of te;

forming at a surface of the epitaxial growth layer a porous layer have a thickness of tps, where the tps and the te satisfy te $\leq$2tps;

forming a non-porous layer on the porous layer;

peeling the non-porpous layer from the substrate; and forming a porous layer on the surface of the epitaxial growth layer after the peeling.

22. The process according to claim 21, which further comprises the steps of:

smoothing the surface of the epitaxial growth layer remaining after the step of peeling;

forming the porous layer at the surface of the remaining epitaxial growth layer thus smoothed;

forming a non-porous layer on the porous layer; and peeling the non-porous layer from the substrate.

* * * * *

UNITED STATES PATENT AND TRADEMARK OFFICE
CERTIFICATE OF CORRECTION

PATENT NO. : 6,326,279 B1
DATED : December 4, 2001
INVENTOR(S) : Yasuo Kakizaki et al.

It is certified that error appears in the above-identified patent and that said Letters Patent is hereby corrected as shown below:

Title page,
Item [57], ABSTRACT,
Line 2, "of" should read -- of a --.

Column 1,
Line 18, "the some" should read -- some --.

Column 2,
Line 47, "affect" should read -- affects --.

Column 3,
Line 21, "a" (second occurrence) should be deleted;
Line 24, "view" should read -- views --;
Line 44, "a" should be deleted; and
Line 50, "substrate 11" should read -- substrate 16 --.

Column 4,
Line 34, "the" should read -- te --.

Column 6,
Line 11, "lies" should read -- lie --.

Column 7,
Line 56, "an" should read -- and --.

Column 8,
Line 67, "flaten" should read -- flatten --.

Column 9,
Line 47, "on" should be deleted.

Column 11,
Line 30, "types" should read -- type --.

Column 12,
Line 19, "tact" should read -- tactics --.

Column 15,
Line 13, "1.1 x 104 Pa)" should read -- 1.1 x $10^4$ Pa) --.

UNITED STATES PATENT AND TRADEMARK OFFICE
CERTIFICATE OF CORRECTION

PATENT NO. : 6,326,279 B1
DATED : December 4, 2001
INVENTOR(S) : Yasuo Kakizaki et al.

It is certified that error appears in the above-identified patent and that said Letters Patent is hereby corrected as shown below:

Column 17,
Line 6, "As" should read -- ¶ As --;
Lines 45 and 62, "second," should read -- second --.

Column 19,
Line 19, 7mA/cm$^2$" should read -- 7mA/cm$^{-2}$ --.

Column 20,
Line 4, "second," should read -- second --.

Column 21,
Line 41, close up right margin.

Column 22,
Line 5, "is" should read -- are --.

Column 26,
Line 22, "to" should read -- into --;
Line 34, "to" should read -- into --;
Line 41, "have" should read -- having --;
Line 42, "te $\leq$ 2tps;" should read -- te $\geq$ 2tps; --; and
Line 44, "non-porpous" should read -- non-porous --.

Signed and Sealed this

Fourteenth Day of May, 2002

Attest:

*Attesting Officer*

JAMES E. ROGAN
*Director of the United States Patent and Trademark Office*